RADIATION HARDENED SEMICONDUCTOR DEVICE

Filed Sept. 18, 1967

INVENTORS:
Robert L. Recko
George C. Messenger
By William W. Rundle
AGENT

United States Patent Office 3,492,547

Patented Jan. 27, 1970

3,492,547

RADIATION HARDENED SEMICONDUCTOR DEVICE

Robert L. Recko, Sunnyvale, and George C. Messenger, Corona Del Mar, Calif., assignors to Northrop Corporation, Beverly Hills, Calif., a corporation of California Filed Sept. 18, 1967, Ser. No. 670,017
Int. Cl. H01l 3/00, 5/00
U.S. Cl. 317—234 11 Claims

ABSTRACT OF THE DISCLOSURE

A semiconductor assembly comprising a basic semiconductor block or wafer, bonding pads thereon for attachment of flexible conductors thereto, terminal ribbons or tabs, and a single structural substrate to which the several components are bonded. All materials and elements have an atomic number of 32 or less, and preferably of 14 or less. The preceding combination is in turn completely encapsulated (except for protruding connection tabs) in a further, protective, casing of a plastic material also composed of substances having an atomic number of 32 or less. In addition, the encapsulating material is preferably acoustically matched to the semiconductor material.

The present invention relates to radiation hardened electronic circuitry, and more particularly, to the combination of particular materials and substances from which such electronic components and assemblies are constructed.

The adverse effects of high energy radiation upon electronic components, particularly of the solid state or semiconductor type, are well known. X-rays, for example, can deposit a large amount of energy in a very short time period, such as energy appearing as heat in the irradiated material. The material is thus heated up before it has time to expand normally, thereby producing a pressure pulse as a mechanical shock. It is an object of the present invention to provide a semiconductor device assembly which is able to withstand the effects of a high radiation environment, particularly of the photon type such as X-rays or gamma rays, but also including neutrons, electrons and other charged particles.

This invention will be more fully understood by reference to the following detailed description of a preferred embodiment, in conjunction with the accompanying drawings.

Figure 1:
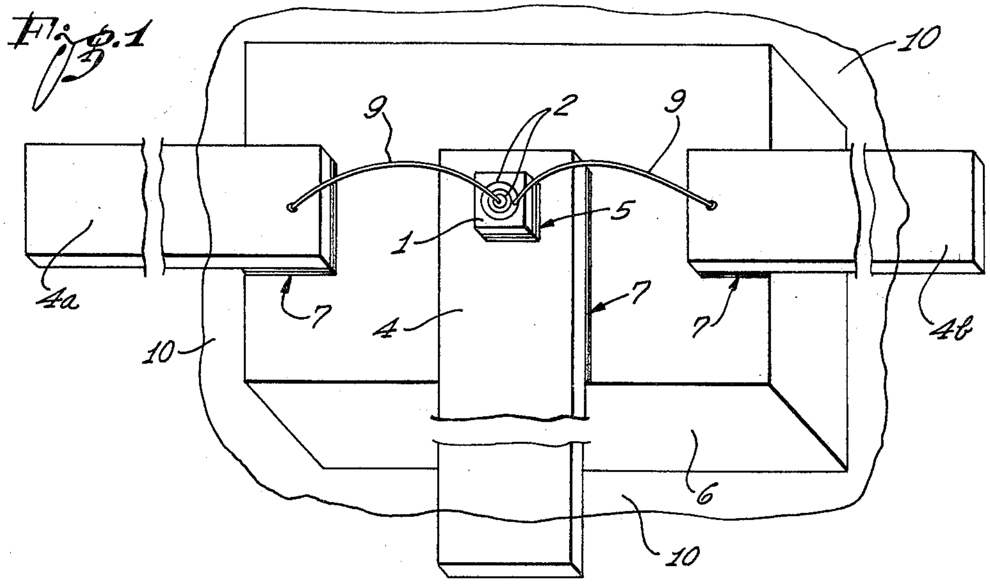
FIGURE 1 is a perspective diagrammatic view of a transistor assembly made according to this invetion.

Referring to FIGURE 1, a silicon transistor 1 is provided with aluminum bonding pads 2 on the collector and emitter elements for example. The body of transistor 1 forms the base element thereof, for example, and the silicon die, as the small chip is called, is firmly attached on one end of an aluminum ribbon or tab 4 which may be about .005-inch thick, .025-inch wide, and .75-inch long, for example. The attaching material 5 may be an aluminum-silicon eutectic, for example. Tab 4 is for use as a connecting terminal to external equipment.

This sub-assembly is further attached to an insulating substrate 6 composed of aluminum oxide or beryllium oxide, for example, using a bonding material 7 of silicon varnish, epoxy resin, or other plastic composed of materials having an atomic number of 32 or less. A substantial portion of the length of tab 4 overhangs the substrate

6 for ease of connecting to other, external, assemblies as will be apparent.

Fine aluminum wires 9, about .001-inch in diameter for example, are attached at one end to the bonding pads 2 and jumped to further aluminum terminal tabs **4*a* and 4*b* which are also attached to substrate 6 similar to the first tab 4. The various tabs 4** should have a minimum spacing distance of about .1-inch from each other.

The entire combination is then preferably covered or encapsulated with a silicon varnish or resin compound 10 similar to bonding material 7, leaving the outer ends of tabs 4, **4*a*, and 4*b* free for external connections, but embedding the wires 9 for protection. The encapsulation 10** is applied around the assembly in uncured form, and is then cured in a conventional manner.

It has been discovered that when the potting or encapsulation 10 is properly acoustically matched to the transistor 1, the energy from the shock of a heavy radiation pulse on the assembly is absorbed or dissipated harmlessly rather than fracturing the semiconductor. In particular, the shock velocity in the encapsulation 10 must be much smaller than in the semiconductor. This condition causes harmless dissipation of the shock energy. Also, the surface velocity of the semiconductor, silicon in the present example, must be greater than the surface velocity of the encapsulation 10, to prevent delamination of the silicon-encapsulation interface.

As a secondary consideration, the velocity of sound in the encapsulation 10 should be high, to match that in the transistor material if possible. An example of a satisfactory material for the purpose of this invention is the epoxy resin adhesive, type LCA–4, obtainable from Bacon Industries, Watertown, Massachusetts. The LCA–4 has a sound velocity roughly one-third that of silicon, which is adequate. It also meets the preferred requirement of being composed of elements having an atomic number of 14 or less. This acoustic matching feature adds to the radiation hardening of the assembly, and the encapsulation 10 also obviously adds rigidity and mechanical protection to the sensitive device areas.

It is thus seen that in the preferred embodiment described, all materials and parts thereof are composed of chemical elements having an atomic number of 14 or less, and are therefore compatible in a radiation environment. However, the semiconductor may contain doping substances having an atomic number greater than 14, but the concentration of such impurity substances is so slight as not to substantially detract from the reliability or performance of the assembly in a high radiation environment. For this reason, the inclusion of such doping ingredients is deemed to come within the teachings and scope of this invention. Further, the components can, if desired, include elements up to and including germanium which is atomic number 32, but the assembly will not be as effectively radiation hardened. This will permit the use of copper and Kovar, if desired. The essence of the invention is to have all elements of as low an atomic number as possible, since the absorption of the radiation increases very rapidly with the atomic number of the irradiated elements.

In other, conventional semiconductor assemblies having any of the heavier elements therein, such as silver or gold conductors, contacts, or junctions, for example, high energy radiation impinging thereon will degrade or destroy the assembly by burning out the high atomic number elements which absorb a high radiation dose and thus generate excessive heat. With constituents as taught herein, however, the assembly will withstand a thermal nuclear environment, for example, by at least a factor of ten better than circuitry which is not made in accordance with this invention.

In some cases, the base element of transistor 1 may appear at the top of the die along with the emitter and collector. In this event, another bonding pad 2 would be included on the die upper surface, along with a third wire lead from it to the first terminal tab 4. The silicon die would still be physically attached to the tab 4. Another modification would be to mount and attach the transistor directly onto the substrate 6, and provide a flexible lead over to each of the terminal tabs as necessary.

Figure 2:
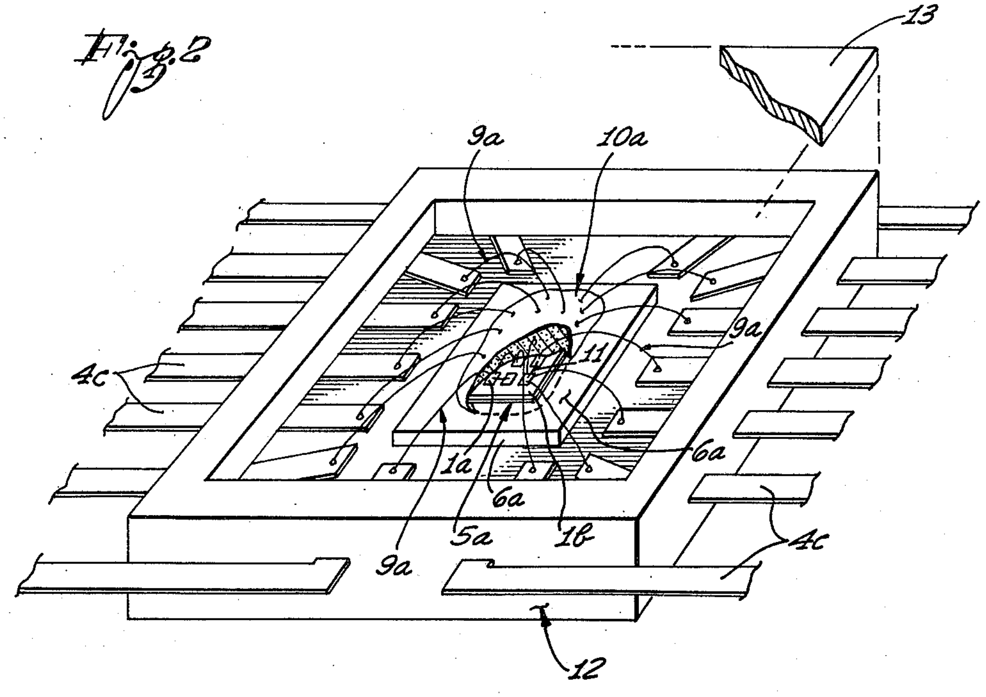
FIGURE 2 is a perspective diagrammatic view showing how a number of such assemblies may be integrated together in a circuit on a common substrate.

The present invention may be accomplished using any semiconductor type components, such as transistors, diodes, silicon-controlled rectifiers, resistor elements, field effects transistors, metal oxide semiconductors, or an integrated circuit array, for example. Instead of the aluminum members as mentioned herein, other electrical conducting materials having a low atomic number may be substituted. FIGURE 2 shows a typical embodiment of the present invention as applied to an integrated circuit comprising many semiconductor devices. Here, a plurality of such devices 1*a* are incorporated on a common silicon chip 1*b*, with aluminum interconnect patterns 11. The chip 1*b* is attached to a single substrate 6*a* by an aluminum or silicon preform material 5*a* similar to the attaching material 5 of FIGURE 1. Substrate 6*a* is mounted, as by a thermosetting epoxy, in a ceramic package 12 (not glass) through which extend the external aluminum terminal tabs 4*c*. Fine aluminum wires 9*a* lead from circuit elements to the tabs 4*c*.

A thermosetting epoxy potting 10*a* encloses the circuitry on the substrate 6*a*. A ceramic cover 13 bonded to the package 12 completes the assembly. Again, all the materials of this assembly are composed of low atomic-number elements as previously explained.

While in order to comply with the statute, the invention has been described in language more or less specific as to structural features, it is to be understood that the invention is not limited to the specific features shown, but that the means and construction herein disclosed comprise the preferred form of putting the invention into effect, and the invention is therefore claimed in any of its forms or modifications within the legitimate and valid scope of the appended claims.

What is claimed is:

1. An electronic assembly comprising a basic semiconductor component having elements for electrical connection thereto, separate terminals adapted for use as external connectors, conducting means connecting said elements respectively to said terminals, and a support substrate upon which said terminals are mounted in spaced relation, no parts of said assembly having constituents with an atomic number greater than 32.

2. Apparatus in accordance with claim 1 wherein said semiconductor comprises a main body solidly mounted on one of said terminals, and wherein said conducting means include flexible connectors leading to other of said terminals.

3. Apparatus in accordance with claim 1 including an encapsulation completely surrounding said assembly except for outer ends of said terminals, said encapsulation being composed of substances having an atomic number of 32 or less.

4. Apparatus in accordance with claim 3 wherein the shock velocity in said encapsulation is less than that in said semiconductor.

5. Apparatus in accordance with claim 4 wherein the surface velocity of said semiconductor resulting from a high energy radiation pulse is greater than that of said encapsulation.

6. Apparatus in accordance with claim 5 wherein the velocity of sound in said encapsulation is high, being of the same order as that in said semiconductor.

7. Apparatus in accordance with claim 1 wherein said conducting means comprise fine aluminum wire leads.

8. A radiation hardened electronic assembly comprising a semiconductor and external connection terminals connected thereto, all of the substances of said assembly having an atomic number of 32 or less.

9. Apparatus in accordance with claim 8 including an encapsulation surrounding substantially all of said assembly, the shock velocity in said encapsulation being less than that in said semiconductor.

10. Apparatus in accordance with claim 8 including an encapsulation surrounding substantially all of said assembly, the surface velocity of said semiconductor being greater than that of said encapsulation.

11. A radiation hardened electronic assembly comprising a semiconductor and external connection terminals connected thereto, all of the substances of said assembly having an atomic number of 14 or less.

References Cited

UNITED STATES PATENTS

| | | | |
|---|---|---|---|
| 3,271,634 | 9/1966 | Heaton | 317—234 |
| 3,271,638 | 9/1966 | Murad | 317—234 |

RODNEY D. BENNETT, Jr., Primary Examiner

CHARLES L. WHITHAM, Assistant Examiner